United States Patent
Kin et al.

(10) Patent No.: US 10,454,254 B2
(45) Date of Patent: Oct. 22, 2019

(54) UNINTERRUPTIBLE POWER SUPPLY

(71) Applicant: FUJI ELECTRIC CO., LTD., Kawasaki-shi, Kanagawa (JP)

(72) Inventors: Seiitsu Kin, Hachioji (JP); Daisuke Kawasaki, Kakogawa (JP); Yoshihiko Yamagata, Kobe (JP); Hiroki Muratsu, Kobe (JP); Tomo Kurozaki, Kobe (JP); Yosuke Iwamaru, Kobe (JP); Keita Koshii, Kobe (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/073,548

(22) PCT Filed: Jul. 4, 2017

(86) PCT No.: PCT/JP2017/024503
§ 371 (c)(1),
(2) Date: Jul. 27, 2018

(87) PCT Pub. No.: WO2018/030035
PCT Pub. Date: Feb. 15, 2018

(65) Prior Publication Data
US 2019/0165552 A1 May 30, 2019

Related U.S. Application Data

(63) Continuation of application No. PCT/JP2017/024503, filed on Jul. 4, 2014.

(30) Foreign Application Priority Data

Aug. 10, 2016 (JP) .................................. 2016-158196

(51) Int. Cl.
*H02B 1/20* (2006.01)
*H02B 1/30* (2006.01)
(Continued)

(52) U.S. Cl.
CPC ............... *H02B 1/202* (2013.01); *H02B 1/30* (2013.01); *H02B 1/565* (2013.01); *H02J 9/062* (2013.01);
(Continued)

(58) Field of Classification Search
None
See application file for complete search history.

(56) References Cited

U.S. PATENT DOCUMENTS 8,159,823 B2 * 4/2012 Murakami ............ H01L 23/473
180/243
9,055,699 B2 * 6/2015 Osato ................. H05K 7/20909
(Continued)

FOREIGN PATENT DOCUMENTS

JP  2006-087269 A  3/2006
JP  2010-098865 A  4/2010
(Continued)

OTHER PUBLICATIONS

PCT/ISA/210, "International Search Report for International Application No. PCT/JP2017/024503," dated Sep. 26, 2017.
(Continued)

*Primary Examiner* — Courtney L Smith
(74) *Attorney, Agent, or Firm* — Manabu Kanesaka

(57) ABSTRACT

An uninterruptible power supply includes an input switch, an input filter, and a power converter disposed in this order, an output filter and an output switch disposed in this order from the power converter, and a plurality of conductors that connects the input switch, the input filter, the power converter, the output filter, and the output switch to each other in this order.

8 Claims, 4 Drawing Sheets

(51) Int. Cl.
*H02B 1/56* (2006.01)
*H02J 9/06* (2006.01)
*H05K 7/20* (2006.01)
*H05K 7/14* (2006.01)
*H02M 7/00* (2006.01)

(52) U.S. Cl.
CPC ....... *H05K 7/1432* (2013.01); *H05K 7/20145* (2013.01); *H05K 7/20172* (2013.01); *H05K 7/20572* (2013.01); *H05K 7/20909* (2013.01); *H02M 7/003* (2013.01)

(56) References Cited

U.S. PATENT DOCUMENTS

| | | | | |
|---|---|---|---|---|
| 2001/0011845 | A1* | 8/2001 | Simonelli | H02J 9/062 307/66 |
| 2003/0048006 | A1* | 3/2003 | Shelter, Jr. | H02J 9/061 307/64 |
| 2005/0088860 | A1* | 4/2005 | Okuma | H02J 9/062 363/35 |
| 2006/0056142 | A1* | 3/2006 | Takahashi | G06F 1/30 361/679.33 |
| 2006/0227579 | A1* | 10/2006 | Glauser | H02J 9/062 363/71 |
| 2013/0057073 | A1* | 3/2013 | Masciarelli | H02J 9/062 307/66 |
| 2014/0176076 | A1* | 6/2014 | Momo | H02J 7/007 320/128 |
| 2015/0035467 | A1* | 2/2015 | MacLennan | H02M 1/12 318/503 |
| 2018/0191194 | A1* | 7/2018 | Nakano | H02M 7/5387 |
| 2019/0052122 | A1* | 2/2019 | Kobayashi | H02J 9/062 |

FOREIGN PATENT DOCUMENTS

| | | |
|---|---|---|
| JP | 2010-148196 A | 7/2010 |
| JP | 2013-158092 A | 8/2013 |

OTHER PUBLICATIONS

PCT/ISA/237, "Written Opinion of the International Searching Authority for International Application No. PCT/JP2017/024503," dated Sep. 26, 2017.

* cited by examiner

UNINTERRUPTIBLE POWER SUPPLY

CROSS-REFERENCE TO RELATED APPLICATION

This application is a continuation of PCT application PCT/JP2017/024503, filed on Jul. 4, 2017, which is based upon and claims priority of Japanese patent application No. 2016-158196, filed on Aug. 10, 2016, the entire contents of which are incorporated herein by reference.

BACKGROUND OF THE INVENTION

Field of the Invention

The present invention relates to an uninterruptible power supply, and more particularly, it relates to an uninterruptible power supply including a power converter.

Description of the Background Art

An uninterruptible power supply including a power converter is known in general. Such an uninterruptible power supply is disclosed in Japanese Patent Laid-Open No. 2010-098865.

Japanese Patent Laid-Open No. 2010-098865 discloses a power converter board including a power converter. On this power converter board, devices that the power converter includes are divided into a plurality of groups. The power converter board includes a plurality of unit cases that can house the devices divided into the groups, respectively. The power converter includes a plurality of connection terminals, a plurality of switches, a plurality of input filters, an output filter, a converter, and an inverter. The plurality of unit cases of the power converter board houses the plurality of connection terminals, the plurality of switches, some of the plurality of the input filters, the remaining input filters, the converter, the output filter, and the inverter, respectively, in this order from the upper side toward the lower side.

However, on the power converter board described in Japanese Patent Laid-Open No. 2010-098865, the unit case that houses the output filter is disposed between the unit case that houses the converter and the unit case that houses the inverter. Therefore, it is necessary to dispose a conducting wire across the unit case, which houses the output filter (a device not to be connected to the converter), in an upward-downward direction in order to connect the converter to the inverter (a device to be connected to the converter) by the conducting wire. Thus, on the power converter board (uninterruptible power supply) described in Japanese Patent Laid-Open No. 2010-098865, it is necessary to provide the conducting wire across the device not to be connected, and hence the length of the conducting wire that connects the devices to each other is disadvantageously increased.

SUMMARY OF THE INVENTION

The present invention has been proposed in order to solve the aforementioned problem, and an object of the present invention is to provide an uninterruptible power supply capable of significantly reducing or preventing an increase in the length of conducting wires that connect devices to each other.

In order to attain the aforementioned object, an uninterruptible power supply according to an aspect of the present invention includes an input switch, an input filter, and a power converter disposed in this order, an output filter and an output switch disposed in this order from the power converter, and a plurality of conductors that connects the input switch, the input filter, the power converter, the output filter, and the output switch to each other in this order.

As described above, the uninterruptible power supply according to this aspect of the present invention includes the input switch, the input filter, and the power converter disposed in this order and the output filter and the output switch disposed in this order from the power converter, and the plurality of conductors that connects the input switch, the input filter, the power converter, the output filter, and the output switch to each other in this order. Thus, devices to be connected to the input switch, the input filter, the power converter, the output filter, and the output switch can be respectively disposed adjacent thereto, and hence it is not necessary to provide the conductors (conducting wires) across devices not to be connected thereto. Consequently, it is possible to significantly reduce or prevent an increase in the length of the conductors that connect the devices to each other. Furthermore, it is possible to significantly reduce or prevent an increase in the length of the conductors, and hence it is possible to significantly reduce or prevent an increase in the power loss of the uninterruptible power supply.

In the aforementioned uninterruptible power supply according to this aspect, the input switch, the input filter, and the power converter are preferably disposed in this order from an upper side toward a lower side. In the vicinity of the input switch, a connection operation for connecting the input switch to a power source is performed. For example, an operation for attaching a connecting member to the input switch is performed. When the input switch is disposed on the lower side (in the vicinity of an installation surface of the uninterruptible power supply) of the uninterruptible power supply, it is necessary to perform the connection operation in the vicinity of the installation surface of the uninterruptible power supply, and hence a worker needs to perform the connection operation with a bent-forward posture while losing his or her balance, and the workability is reduced. In consideration of this point, according to the present invention, in a housing, the input switch, the input filter, and the power converter are disposed in this order from the upper side toward the lower side, and hence the worker that performs the above connection operation can easily perform the connection operation for the input switch disposed on the relatively upper side. Accordingly, the worker can perform the operation in a standing posture without relatively losing his or her balance, and hence the connection workability can be improved.

In this case, the output filter and the output switch are preferably disposed in this order from the power converter toward the upper side. According to this configuration, the output switch is also disposed on the relatively upper side similarly to the input switch, and hence the connection workability can be further improved. In addition, the power converter, which is heavier than each of the input filter, the input switch, the output filter, and the output switch, is housed on the lower side relative to the input filter, the input switch, the output filter, and the output switch, and hence the center of gravity of the uninterruptible power supply can be located on the relatively lower side (the lower side of the housing). Consequently, it is possible to significantly reduce or prevent overturning of the uninterruptible power supply (housing), for example.

The aforementioned uninterruptible power supply in which the output filter and the output switch are disposed in this order from the power converter toward the upper side preferably further includes a first case that houses the power converter, a second case that houses the input filter and the output filter, and a third case that houses the input switch and the output switch.

In the aforementioned uninterruptible power supply in which the output filter and the output switch are housed in this order from the power converter toward the upper side, the power converter preferably includes a rectifier circuit connected to the input filter, a chopper circuit connected to the rectifier circuit, and an inverter circuit connected to the chopper circuit, the input switch, the input filter, the rectifier circuit, and the chopper circuit are preferably disposed in this order from the upper side toward the lower side, and the inverter circuit, the output filter, and the output switch are preferably disposed in this order from the lower side toward the upper side. According to this configuration, the devices to be connected to each other are disposed adjacent to each other in the power converter, and hence it is not necessary to provide conducting wires across devices not to be connected. Consequently, it is possible to further significantly reduce or prevent an increase in the length of the conducting wires that connect the devices to each other.

The aforementioned uninterruptible power supply according to this aspect preferably further includes a housing that houses the input switch, the input filter, the power converter, the output filter, and the output switch, a ventilation path in which air flows from an outside of the housing to another outside of the housing through the power converter and the input filter or the output filter, and a partition wall that separates the ventilation path from both the input switch and the output switch. According to this configuration, the power converter and the input filter or the output filter can be cooled due to the ventilation path.

In this case, the uninterruptible power supply preferably further includes a housing that houses the input switch, the input filter, the power converter, the output filter, and the output switch, and a ventilation path in which air flows from an outside of the housing to another outside of the housing through the power converter and the input filter or the output filter, the ventilation path preferably includes an air guide path provided between the housing and all of the first case, the second case, and the third case, and the third case is preferably airtight against the air guide path. According to this configuration, the third case, in which the input switch or the output switch that generates less heat than the power converter, the input filter, and the output filter is housed, is airtight against the air guide path such that the power converter and the input filter or the output filter that generate relatively more heat can be effectively forcibly cooled without increasing the size of a fan for ventilation.

The aforementioned uninterruptible power supply including the ventilation path preferably further includes a fan disposed in the housing and that discharges air inside the housing to the another outside of the housing, a plurality of uninterruptible power supply modules including fans on upper surfaces of housings of the plurality of uninterruptible power supply modules and disposed adjacent to each other in a right-left direction, an input bus that connects input switches of the plurality of uninterruptible power supply modules to each other, an output bus that connects output switches of the plurality of uninterruptible power supply modules to each other, and a division wall that separates the plurality of uninterruptible power supply modules adjacent to each other from each other, and the division wall preferably includes openings in which the input bus and the output bus are disposed. According to this configuration, the division wall can significantly reduce or prevent ventilation between the plurality of uninterruptible power supply modules while the plurality of uninterruptible power supply modules can be connected to each other via the openings by the input bus and the output bus. Consequently, it is possible to significantly reduce or prevent thermal interference due to ventilation between the plurality of uninterruptible power supply modules.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.

[First Embodiment]

(Overall Configuration and Circuit Configuration)

First, the overall configuration and circuit configuration of an uninterruptible power supply (UPS) 100 (or PCS: a power conditioning system) according to a first embodiment is described with reference to FIGS. 1 and 2.

Figure 1:
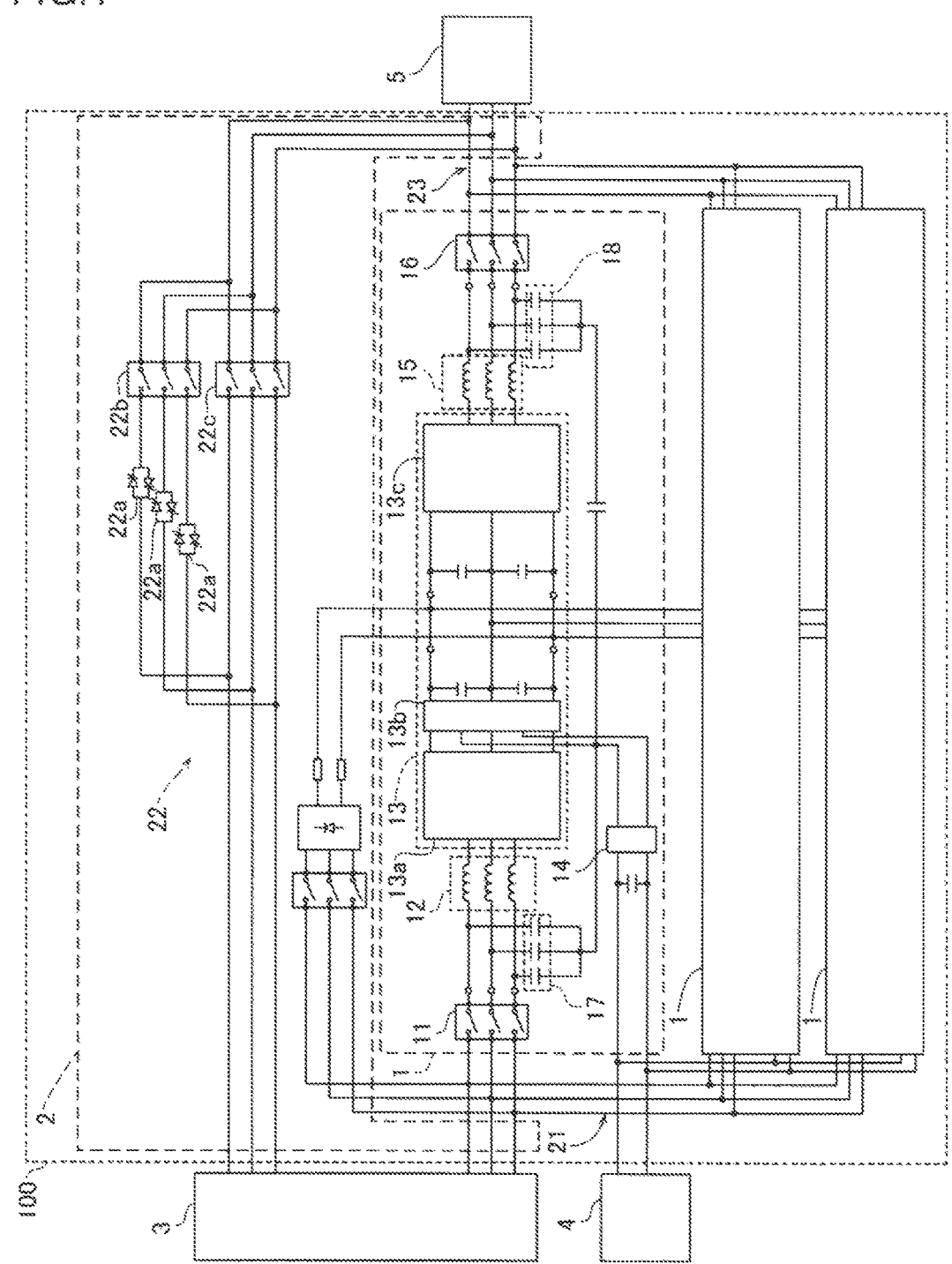
FIG. 1 is a circuit configuration diagram of an uninterruptible power supply according to a first embodiment of the present invention.

As shown in FIG. 1, the uninterruptible power supply 100 includes a plurality of (three in FIG. 1) uninterruptible power supply modules 1 and an input/output module 2 (I/O module). As shown in FIG. 2, the plurality of uninterruptible power supply modules 1 is disposed adjacent to each other in a right-left direction. The input/output module 2 is disposed adjacent to the uninterruptible power supply modules 1 in the right-left direction. For example, in FIG. 2, the input/output module 2 is disposed on the left side (arrow X1 direction side) of the plurality of uninterruptible power supply modules 1. In the uninterruptible power supply 100, the plurality of uninterruptible power supply modules 1 and the input/output module 2 are coupled to each other by input buses 21 and output buses 23 as coupling members (connecting members).

In this specification, the term "right-left direction" denotes a right-left direction as viewed from the front side of the uninterruptible power supply 100, and the term "front side" denotes a surface side that provides access to the inside of the uninterruptible power supply 100. For example, in FIG. 2, the "left direction" denotes an arrow X1 direction, and the "right direction" denotes an arrow X2 direction. In addition, the "front side" denotes an arrow Y1 direction side, and the "back side" denotes an arrow Y2 direction side. The term "upward-downward direction" denotes a direction perpendicular to the ground (floor) and parallel to a Z-axis.

That is, the "upward direction (upper side)" denotes an arrow Z1 direction (arrow Z1 direction side), and the "downward direction (lower side)" denotes an arrow Z2 direction (arrow Z2 direction side).

As shown in FIG. 1, an uninterruptible power supply module 1 includes input switches 11 (switches for input). The input switches 11 are connected to an AC power source 3 (commercial power source) via the input buses 21, and receive AC power from the AC power source 3. An input switch 11 is provided for each phase (U-phase, V-phase, and W-phase), and a total of three input-side switches 11 are provided in the uninterruptible power supply module 1.

The uninterruptible power supply module 1 includes input filters 12 (input-side filters). The input filters 12 are connected to the input switches 11. An input filter 12 is provided for each phase, and a total of three input filters 12 are provided in the uninterruptible power supply module 1.

The uninterruptible power supply module 1 includes a power converter 13. The power converter 13 is connected to the input switches 11 via the input filters 12. The power converter 13 includes a rectifier circuit 13a, a chopper circuit 13b, and an inverter circuit 13c. In addition, the power converter 13 includes elements made of silicon carbide (SiC). Thus, as compared with the case where the power converter 13 includes elements made of silicon, the power loss of the power converter 13 is reduced, and the amount of heat generation due to the power loss is reduced.

The rectifier circuit 13a has a function of converting the AC power input into the power converter 13 into DC power. The chopper circuit 13b is configured as a three-level chopper circuit, for example. That is, the chopper circuit 13b has a function of transforming the voltage of the DC power obtained by conversion by the rectifier circuit 13a and outputting the voltage as three levels of voltage. The DC power, the voltage of which has been transformed by the chopper circuit 13b, is stored in a battery 4 via a DC reactor 14.

The inverter circuit 13c is configured as a three-level inverter circuit. That is, the inverter circuit 13c has a function of converting the DC power having three levels of voltage obtained by transformation by the chopper circuit 13b into AC power and outputting the AC power. Therefore, the chopper circuit 13b is configured as a three-level chopper circuit, and the inverter circuit 13c is configured as a three-level inverter circuit such that as compared with the case where the chopper circuit 13b and the inverter circuit 13c are configured as two-level circuits, the power loss is reduced, and the amount of heat generation due to the power loss is reduced.

The uninterruptible power supply module 1 includes output filters 15. The output filters 15 are connected to the inverter circuit 13c of the power converter 13. An output filter 15 is provided for each phase, and a total of three output filters 15 are provided in the uninterruptible power supply module 1.

The uninterruptible power supply module 1 includes output switches 16. The output switches 16 output AC power received from the power converter 13 via the output filters 15. An output switch 16 is provided for each phase, and a total of three output switches 16 are provided in the uninterruptible power supply module 1.

The uninterruptible power supply module 1 includes input-side filter capacitors 17 (hereinafter referred to as the "input capacitors 17") provided between the input switches 11 and the input filters 12. The uninterruptible power supply module 1 further includes output-side filter capacitors 18 (hereinafter referred to as the "output capacitors 18") provided between the output switches 16 and the output filters 15.

The input switches 11, the input filters 12, the power converter 13, the output filters 15, the output switches 16, the input capacitors 17, and the output capacitors 18 are included in each of the plurality of uninterruptible power supply modules 1.

The uninterruptible power supply 100 includes a direct transmission circuit 22. The direct transmission circuit 22 is provided in the input/output module 2, and is connected to the AC power source 3 and the output side (load side) of the plurality of uninterruptible power supply modules 1. The direct transmission circuit 22 includes thyristor switches 22a and mechanical switches 22b connected in series to the thyristor switches 22a. The direct transmission circuit 22 includes mechanical switches 22c connected in parallel to the thyristor switches 22a and the mechanical switches 22b connected in series to each other.

According to the first embodiment, the uninterruptible power supply 100 includes the input buses 21 that connect the input switches 11 of the plurality of uninterruptible power supply modules 1 to each other. The input buses 21 are connected to the inside of the input/output module 2, and transmit AC power to the input switches 11 via the input/output module 2.

According to the first embodiment, the uninterruptible power supply 100 includes the output buses 23 that connect the output switches 16 of the plurality of uninterruptible power supply modules 1 to each other. The output buses 23 are connected to the inside of the input/output module 2, and supply AC power from the output switches 16 or the direct transmission circuit 22 via the input/output module 2 to a load 5.

Figure 2:
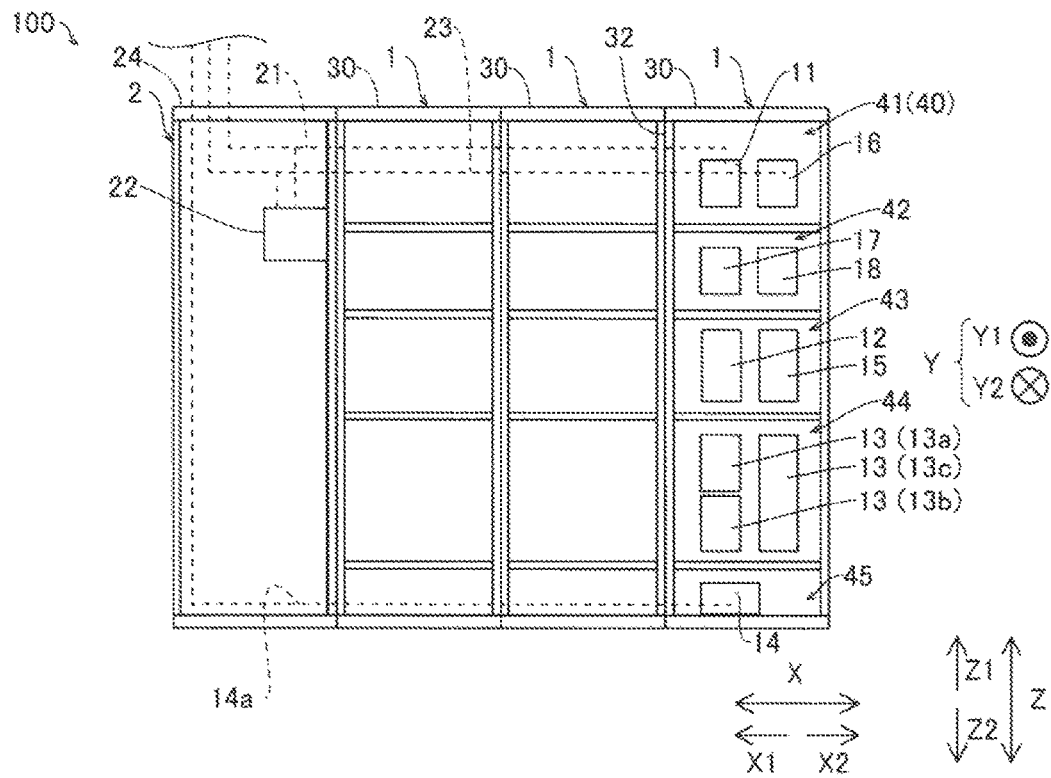
FIG. 2 is a front view schematically showing the uninterruptible power supply according to the first embodiment of the present invention.

As shown in FIG. 2, the input buses 21 and the output buses 23 are connected to the AC power source 3 (see FIG. 1) and the load 5 (see FIG. 1) via an opening provided in the upper surface 24 of the input/output module 2, for example.

(Configuration Relating to Arrangement of Devices)

Next, a configuration relating to the arrangement of devices inside housings 30 of the uninterruptible power supply modules 1 is described with reference to FIGS. 2 to 4. The uninterruptible power supply 100 (uninterruptible power supply modules 1) is configured as a cubicle type uninterruptible power supply. That is, each of the uninterruptible power supply modules 1 includes a housing 30 made of metal and having a box shape.

As shown in FIG. 2, the input switches 11, the input filters 12, the power converter 13, the DC reactor 14, the output filters 15, and the output switches 16 are housed (disposed) inside the housing 30 having a box shape.

According to the first embodiment, in the housing 30, the input switches 11, the input filters 12, and the power converter 13 are housed in this order from the upper side (upper surface 31) toward the lower side (arrow Z2 direction side), and the output filters 15 and the output switches 16 are housed (disposed) in this order from the power converter 13 toward the upper side (arrow Z1 direction side).

Figure 4:
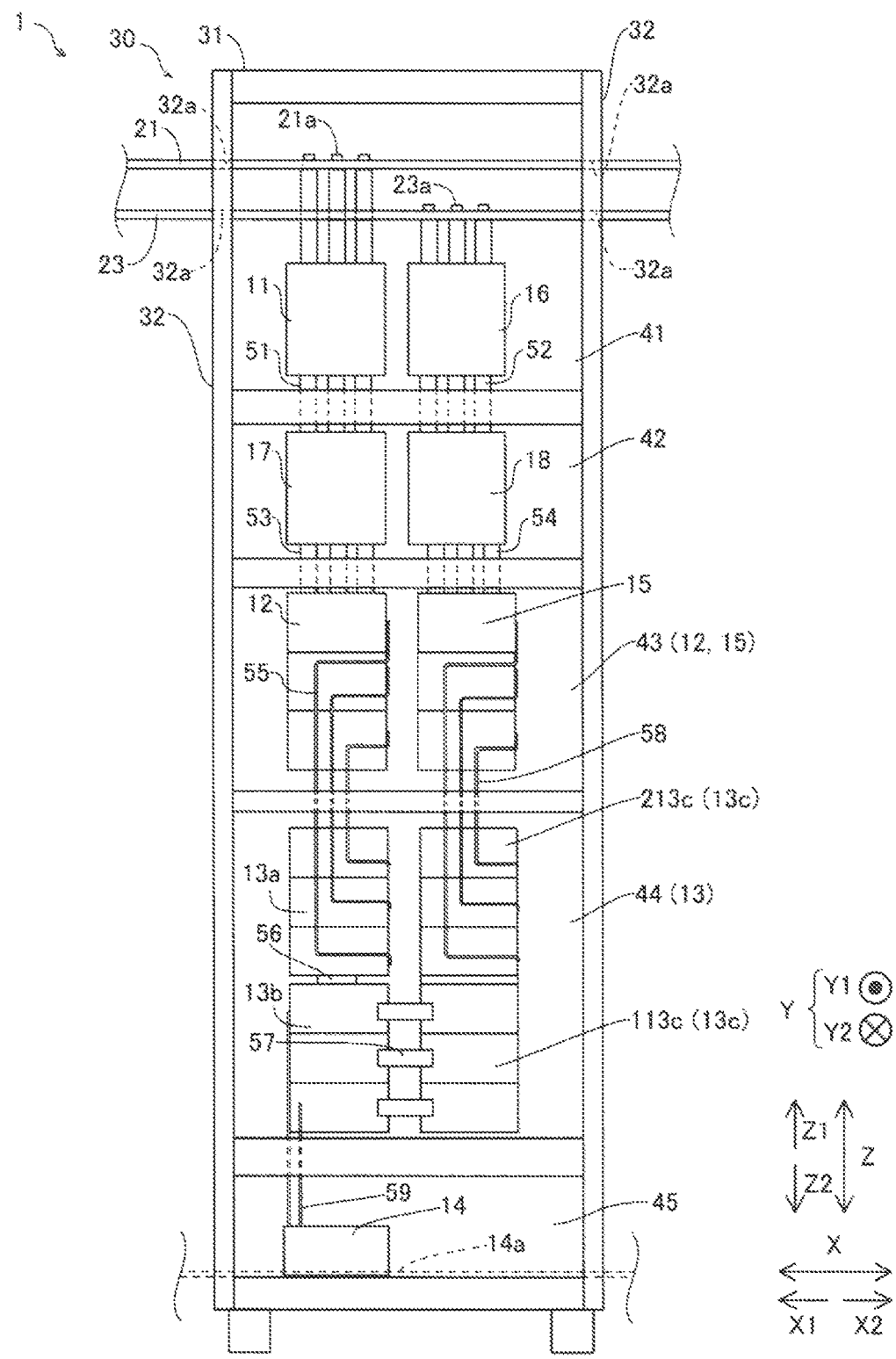
FIG. 4 is a diagram for illustrating an arrangement of devices of the uninterruptible power supply module according to the first embodiment of the present invention.

Specifically, as shown in FIG. 4, according to the first embodiment, in the housing 30, the input switches 11, the input capacitors 17, the input filters 12, the rectifier circuit 13a, and the chopper circuit 13b are housed in this order from the upper side toward the lower side, and the inverter circuit 13c, the output filters 15, the output capacitors 18, and the output switches 16 are housed in this order from the lower side toward the upper side. In other words, the input switches 11, the input capacitors 17, the input filters 12, the rectifier circuit 13a, and the chopper circuit 13b are disposed adjacent to each other in this order from the upper side toward the lower side. Furthermore, the inverter circuit 13c, the output filters 15, the output capacitors 18, and the output switches 16 are disposed adjacent to each other in this order from the lower side toward the upper side. In addition, the input filters 12 and the output filters 15 are disposed adjacent to each other in the right-left direction. A detailed description is provided below.

According to the first embodiment, the housing 30 houses the devices, and includes a plurality of cases 40 arranged in the upward-downward direction. The plurality of cases 40 includes a switch case 41, a capacitor case 42, a filter case 43, a power conversion case 44, a DC reactor case 45, and a fan case 46. The power conversion case 44 is an example of a "first case" in the claims. The filter case 43 is an example of a "second case" in the claims. The switch case 41 is an example of a "third case" in the claims.

The switch case 41 is disposed on the most arrow Z1 direction side (in the uppermost stage) of the housing 30 and on the arrow Y1 direction side of the fan case 46. The switch case 41 houses the input switches 11 in which the input buses 21 are connected to input connectors 21a and the output switches 16 in which the output buses 23 are connected to output connectors 23a. For example, the input switches 11 are disposed on the arrow X1 direction side in the switch case 41, and the output switches 16 are disposed on the arrow X2 direction side in the switch case 41.

The input connectors 21a and the output connectors 23a are disposed at positions accessible from the front side of the housing 30. For example, the positions accessible from the front side of the housing 30 denote positions in an area corresponding to the length of the arm of a general worker from the front end of the housing 30 toward the inside of the housing 30.

The input buses 21 and the output buses 23 each have a bar shape (are configured as a bus bar), and extend in the right-left direction. The input buses 21 and the output buses 23 are disposed via openings 32a provided in division walls 32 of the switch case 41 in the right-left direction. That is, as shown in FIG. 2, the input buses 21 and the output buses 23 extend over the plurality of uninterruptible power supply modules 1 and the input/output module 2 via the openings 32a of the uninterruptible power supply module 1 and openings 32a provided in a division wall(s) 32 of the adjacent uninterruptible power supply modules 1 or input/output module 2.

As shown in FIG. 4, the division walls 32 serve as partition walls from the adjacent uninterruptible power supply modules 1, and define side surfaces of the housing 30 in the right-left direction. The division walls 32 have a function of significantly reducing or preventing ventilation between a plurality of adjacent uninterruptible power supply modules 1.

The capacitor case 42 is disposed adjacent to the fan case 46 (see FIG. 5), and is disposed on the arrow Z2 direction side of the fan case 46. The capacitor case 42 houses the input capacitors 17 and the output capacitors 18. For example, the input capacitors 17 are disposed on the arrow X1 direction side in the capacitor case 42, and the output capacitors 18 are disposed on the arrow X2 direction side in the capacitor case 42.

The uninterruptible power supply module 1 includes a plurality of power lines 51 to 58 that connects the input switches 11, the input capacitors 17, the input filters 12, the power converter 13, the output filters 15, the output capacitors 18, and the output switches 16 to each other in this order. The input capacitors 17 are connected to the input switches 11 via the power lines 51. The output capacitors 18 are connected to the output switches 16 via the power lines 52. For example, each of the power lines 51 and 52 is provided in a bar shape for each of the three phases independently. The power lines 51 to 58 are examples of a "conductor" in the claims.

The filter case 43 is disposed adjacent to the capacitor case 42, and is disposed on the arrow Z2 direction side of the capacitor case 42. The filter case 43 houses the input filters 12 and the output filters 15. For example, the input filters 12 are disposed on the arrow X1 direction side in the filter case 43, and the output filters 15 are disposed on the arrow X2 direction side in the filter case 43.

The input filters 12 are connected to the input switches 11 and the input capacitors 17 via the power lines 51 and the power lines 53. Furthermore, the output filters 15 are connected to the output switches 16 and the output capacitors 18 via the power lines 52 and the power lines 54. For example, each of the power lines 53 and 54 is provided in a bar shape for each of the three phases independently.

The power conversion case 44 is disposed adjacent to the filter case 43, and is disposed on the arrow Z2 direction side of the filter case 43. The power conversion case 44 houses the power converter 13. For example, in the power conversion case 44, the rectifier circuit 13a of the power converter 13 is disposed on the arrow X1 direction side and on the arrow Z1 direction side. The rectifier circuit 13a is connected to the input filters 12 via the power lines 55.

In the power conversion case 44, the chopper circuit 13b of the power converter 13 is disposed on the arrow X1 direction side and on the arrow Z2 direction side. The chopper circuit 13b is connected to the rectifier circuit 13a via the power lines 56.

In the power conversion case 44, the inverter circuit 13c of the power converter 13 is disposed on the arrow X2 direction side. For example, an input 113c of the inverter circuit 13c is disposed on the arrow Z2 direction side in the power conversion case 44, and the input 113c and the chopper circuit 13b are connected to each other via the power lines 57. An output 213c of the inverter circuit 13c is disposed on the arrow Z1 direction side relative to the input 113c, and the output 213c and the output filters 15 are connected to each other via the power lines 58.

The DC reactor case 45 is disposed adjacent to the power conversion case 44, and is disposed on the arrow Z2 direction side of the power conversion case 44. The DC reactor case 45 houses the DC reactor 14. The DC reactor 14 is connected to the chopper circuit 13b via power lines 59. The DC reactor 14 is connected to the battery 4 via a DC bus 14a.

Figure 5:
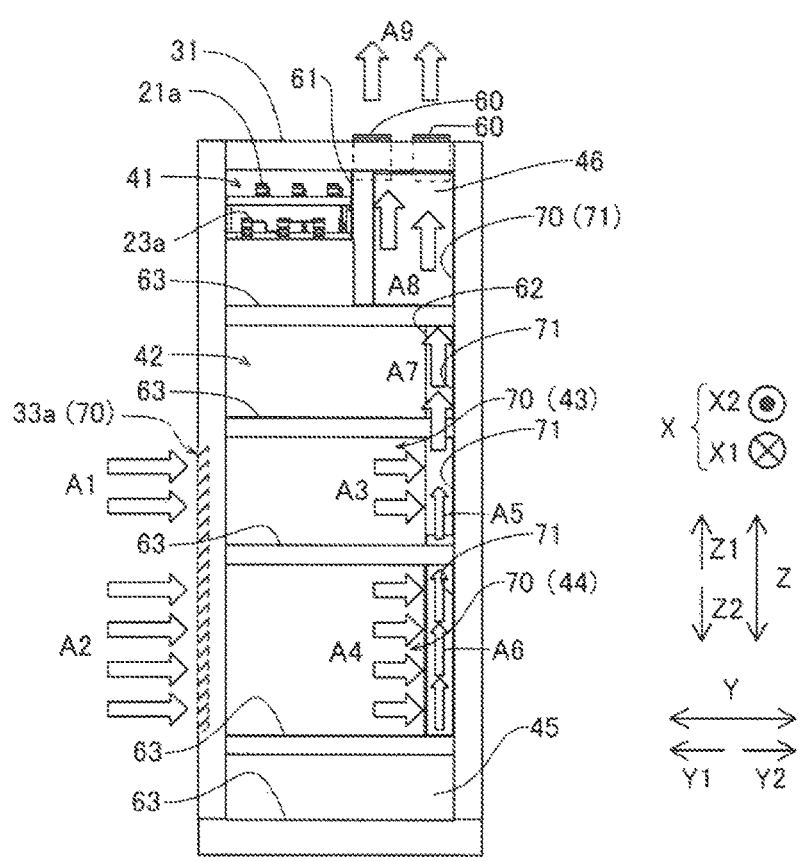
FIG. 5 is a diagram for illustrating a configuration relating to cooling of the uninterruptible power supply according to the first embodiment of the present invention.

As shown in FIG. 5, the fan case 46 is disposed adjacent to the switch case 41, and is disposed on the arrow Y2 direction side of the switch case 41. That is, the fan case 46 is disposed in the vicinity (the uppermost stage, for example) of the upper surface 31 of the housing 30. In the fan case 46, fans 60 that discharge air inside the housing 30 to the outside of the housing 30 to create a negative pressure inside the housing 30 relative to a pressure outside the housing 30 are disposed. According to the first embodiment, a partition wall 61 that significantly reduces or prevents ventilation is provided between the fan case 46 and the switch case 41. In addition, a partition wall 62 that significantly reduces or prevents ventilation is provided between the capacitor case 42 and a ventilation path 70 described later.

(Configuration Relating to Cooling Inside Housing)

Next, a configuration relating to cooling inside the housing 30 of the uninterruptible power supply 100 (uninterruptible power supply module 1) is described with reference to FIGS. 2 to 5.

Figure 3:
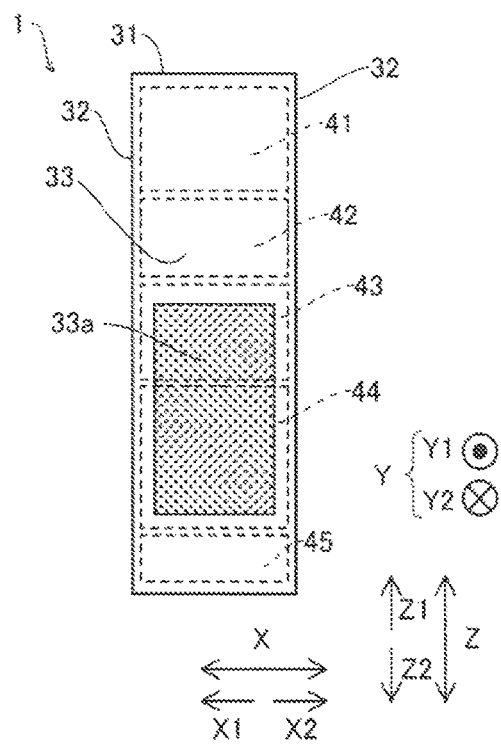
FIG. 3 is a front view schematically showing the appearance of an uninterruptible power supply module according to the first embodiment of the present invention.

As shown in FIG. 3, the housing 30 includes an openable and closable front door 33 so as to expose the front side (arrow Y1 direction side) of the plurality of cases 40. In a state where the front door 33 is opened, a worker can access the devices in the housing 30 (see FIG. 4).

As shown in FIG. 3, the front door 33 includes a ventilation hole region 33a including a plurality of ventilation holes and made of punching metal, a wire mesh, or the like. For example, the ventilation hole region 33a is provided at a position of the front door 33 that faces the arrow Y1 direction sides of the filter case 43 and the power conversion case 44. For example, the open area of the ventilation hole region 33a is 30% or more, and preferably 50%.

Thus, even in a state where the front door 33 is closed, ventilation between the inside of the housing 30 and the outside of the housing 30 can be provided through the ventilation holes 33a. Specifically, the fans 60 create a negative pressure inside the housing 30 relative to the pressure outside the housing 30 such that air is taken from the outside of the housing 30 into the housing 30 through the ventilation holes 33a (see arrows A1 and A2 in FIG. 5).

In the ventilation path 70, air flows from the outside of the housing 30 to the fans 60 through the power converter 13, the input filters 12, and the output filters 15 via the ventilation holes 33a provided in the housing 30 (arrow A1 to arrow A9).

Specifically, according to the first embodiment, the ventilation path 70 includes an air guide path 71 that does not guide air between the switch case 41 and the fans 60, but guides air between the fans 60 and both the filter case 43 and the power conversion case 44, as shown in FIG. 5. That is, the switch case 41 is airtight against the air guide path 71.

More specifically, the air guide path 71 is disposed on the back side (arrow Y2 direction side) relative to the switch case 41, the filter case 43, and the power conversion case 44 of the plurality of cases 40, and has a tubular shape that extends in the upward-downward direction. Although ventilation can be provided between the back side of both the filter case 43 and the power conversion case 44 and the air guide path 71, the partition wall 61 prevents ventilation between the switch case 41 and the air guide path 71, and the partition wall 62 prevents ventilation between the capacitor case 42 and the air guide path 71.

Partition walls 63 are provided between the plurality of cases 40 adjacent to each other. Thus, ventilation is not provided between the plurality of cases 40 adjacent to each other, and hence it is possible to significantly reduce or prevent thermal interference between the plurality of cases 40 adjacent to each other.

(About Air Flow)

Next, air flow (ventilation) in the uninterruptible power supply 100 (uninterruptible power supply module 1) is described with reference to FIG. 5.

The fans 60 are driven to discharge air in the air guide path 71 of the ventilation path 70 and air in the filter case 43 and the power conversion case 44 to the outside of the housing 30 such that a negative pressure is created inside the filter case 43 and the power conversion case 44 relative to the pressure outside the housing 30. The partition wall 61 prevents ventilation between the switch case 41 and the fan case 46, and hence a negative pressure is not created inside the switch case 41, and ventilation to the adjacent uninterruptible power supply modules 1 through the openings 32a is significantly reduced or prevented.

Air is taken from the outside of the housing 30 into the filter case 43 and the power conversion case 44 through the ventilation holes 33a (arrow A1 and arrow A2), and the air flows through the heated filter case 43 and the heated power conversion case 44 (arrow A3 and arrow A4) such that the filter case 43 and the power conversion case 44 are cooled. At this time, the partition walls 63 prevent ventilation between the plurality of cases 40, and hence thermal interference between the plurality of cases 40 is significantly reduced or prevented.

The air that has flowed through the filter case 43 and the power conversion case 44 flows into the air guide path 71 of the ventilation path 70, is guided through the air guide path 71 (arrow A5 to arrow A8), and is discharged by the fans 60 from the upper surface 31 of the housing 30 (arrow A9). At this time, ventilation is not provided between the cases 40 other than the filter case 43 and the power conversion case 44 and the air guide path 71.

[Effects of First Embodiment]

According to the first embodiment, the following effects can be obtained.

According to the first embodiment, as described above, the housing 30 houses the input switches 11, the input filters 12, and the power converter 13 in this order from the upper side toward the lower side, and houses the output filters 15 and the output switches 16 in this order from the power converter 13 toward the upper side. Thus, the devices to be connected to the input switches 11, the input filters 12, the power converter 13, the output filters 15, and the output switches 16 can be respectively disposed adjacent thereto in the upward-downward direction such that it is not necessary to provide the power lines 51 to 59 across devices not to be connected thereto. Consequently, it is possible to significantly reduce or prevent an increase in the length of the power lines 51 to 59 that connect the devices to each other. Accordingly, it is possible to significantly reduce or prevent an increase in the length of the power lines 51 to 59, and hence it is possible to significantly reduce or prevent an increase in the power loss of the uninterruptible power supply 100.

According to the first embodiment, as described above, the housing 30 houses the input switches 11, the input filters 12, and the power converter 13 in this order from the upper side toward the lower side. In the vicinity of the input switches 11, a connection operation for connecting the input switches 11 to the AC power source 3 is performed. For example, an operation for attaching the input buses 21 to the input switches 11 is performed. When the input switches 11 are disposed on the lower side (in the vicinity of an installation surface of the uninterruptible power supply 100: a surface on the arrow Z2 direction side) of the uninterruptible power supply 100, it is necessary to perform the connection operation in the vicinity of the installation surface of the uninterruptible power supply 100, and hence the worker needs to perform the connection operation with a bent-forward posture while losing his or her balance, and the workability is reduced. In consideration of this point, according to the first embodiment, the housing 30 houses the input switches 11, the input filters 12, and the power converter 13 in this order from the upper side toward the lower side, and hence the worker that performs the above connection operation can easily perform the connection operation for the input switches 11 disposed on the relatively upper side of the housing 30. Accordingly, the worker can perform the operation in a standing posture without relatively losing his or her balance, and hence the connection workability can be improved.

According to the first embodiment, as described above, the housing 30 houses the output filters 15 and the output switches 16 in this order from the power converter 13 toward the upper side. Thus, the output switches 16 are also disposed on the relatively upper side of the housing 30 similarly to the input switches 11, and hence the connection workability can be further improved. In addition, the power converter 13, which is heavier than the input filters 12, the input switches 11, the output filters 15, and the output switches 16, is housed on the lower side of the housing 30 relative to the input filters 12, the input switches 11, the output filters 15, and the output switches 16, and hence the center of gravity of the uninterruptible power supply 100 can be located on the relatively lower side of the housing 30. Consequently, it is possible to significantly reduce or prevent overturning of the housing 30, for example.

According to the first embodiment, as described above, the rectifier circuit 13a connected to the input filters 12, the chopper circuit 13b connected to the rectifier circuit 13a, and the inverter circuit 13c connected to the chopper circuit 13b are provided in the power converter 13. Furthermore, the housing 30 houses the input switches 11, the input filters 12, the rectifier circuit 13a, and the chopper circuit 13b in this order from the upper side toward the lower side, and houses the inverter circuit 13c, the output filters 15, and the output switches 16 in this order from the lower side toward the upper side. Thus, the devices to be connected to each other are disposed adjacent to each other also in the power converter 13, and hence it is not necessary to provide the power lines 51 to 59 across devices not to be connected. Consequently, it is possible to further significantly reduce or prevent an increase in the length of the power lines 51 to 59 that connect the devices to each other, and hence it is possible to further significantly reduce or prevent an increase in the power loss of the uninterruptible power supply.

According to the first embodiment, as described above, each of the uninterruptible power supply modules 1 includes the fans 60 disposed in the vicinity of the upper surface 31 of the housing 30 and discharging the air inside the housing 30 to the outside of the housing 30 and the ventilation path 70 in which the air flows from the outside of the housing 30 to the fans 60 through the power converter 13, the input filters 12, and the output filters 15 via the ventilation holes 33a provided in the front door 33 of the housing 30. Thus, the power converter 13, the input filters 12, and the output filters 15 can be forcibly cooled by the fans 60 and the ventilation path 70.

According to the first embodiment, as described above, the power conversion case 44 in which the power converter 13 is housed, the filter case 43 in which the input filters 12 and the output filters 15 are housed, and the switch case 41 in which the input switches 11 and the output switches 16 are housed are provided in the housing 30. Furthermore, the air guide path 71 that does not guide air between the switch case 41 and the fans 60, but guides air between the fans 60 and both the power conversion case 44 and the filter case 43 is provided in the ventilation path 70. Thus, air is not guided between the switch case 41, in which the input switches 11 and the output switches 16 that generate less heat than the power converter 13, the input filters 12, and the output filters 15 are housed, and the fans 60 such that the power converter 13, the input filters 12, and the output filters 15 that generate relatively more heat can be effectively forcibly cooled without increasing the size of the fans 60.

According to the first embodiment, as described above, the uninterruptible power supply 100 includes the plurality of uninterruptible power supply modules 1 including the fans 60 on the upper surfaces 31 of the housings 30 thereof and disposed adjacent to each other in the right-left direction, the input buses 21 that connect the input switches 11 of the plurality of uninterruptible power supply modules 1 to each other, the output buses 23 that connect the output switches 16 of the plurality of uninterruptible power supply modules 1 to each other, and the division walls 32 that separate the plurality of uninterruptible power supply modules 1 adjacent to each other from each other. Furthermore, the division walls 32 include the openings 32a in which the input buses 21 and the output buses 23 are disposed. Thus, the division walls 32 can significantly reduce or prevent ventilation between the plurality of uninterruptible power supply modules 1 while the plurality of uninterruptible power supply modules 1 can be connected to each other via the openings 32a by the input buses 21 and the output buses 23. Consequently, it is possible to significantly reduce or prevent thermal interference due to ventilation between the plurality of uninterruptible power supply modules 1.

According to the first embodiment, as described above, the partition wall 61 that significantly reduces or prevents ventilation between the switch case 41 including the openings 32a and the ventilation path 70 is preferably provided in the housing 30. Thus, the partition wall 61 significantly reduces or prevents ventilation between the ventilation path 70 through which air is guided to the fans 60 and the switch case 41, and hence it is possible to more reliably significantly reduce or prevent thermal interference due to ventilation between the plurality of uninterruptible power supply modules 1 through the openings 32a.

[Second Embodiment]

Figure 6:
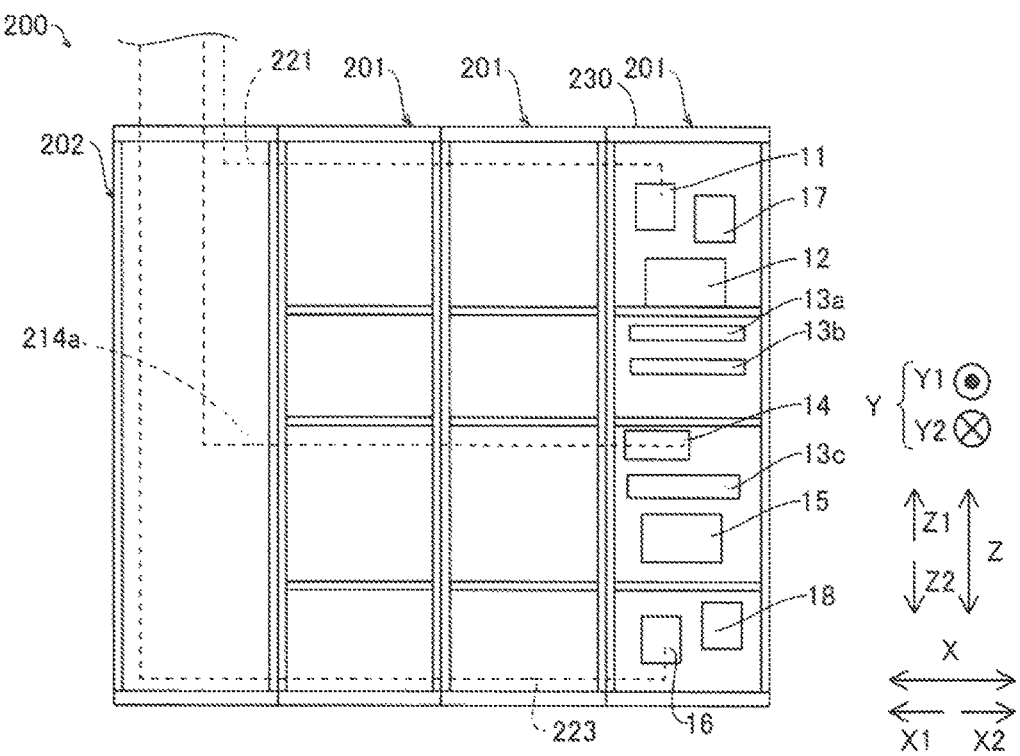
FIG. 6 is a front view schematically showing an uninterruptible power supply according to a second embodiment of the present invention.

The configuration of an uninterruptible power supply 200 according to a second embodiment is now described with reference to FIG. 6. In the uninterruptible power supply 200 according to the second embodiment, a housing 230 houses output filters 15 and output switches 16 in this order from a power converter 13 toward the lower side, unlike the uninterruptible power supply 100 according to the first embodiment in which the housing 30 houses the output filters 15 and the output switches 16 in this order from the power converter 13 toward the upper side. The same configurations as those of the first embodiment are denoted by the same reference numerals, and description thereof is omitted.

The uninterruptible power supply 200 according to the second embodiment includes a plurality of (three, for example) uninterruptible power supply modules 201 and an input/output module 202.

According to the second embodiment, the housing 230 of each of the uninterruptible power supply modules 201 houses input switches 11, input filters 12, and the power converter 13 in this order from the upper side toward the lower side, and houses the output filters 15 and the output switches 16 in this order from the power converter 13 toward the lower side.

Specifically, according to the second embodiment, the input switches 11, the input capacitors 17, the input filters 12, a rectifier circuit 13a, a chopper circuit 13b, a DC reactor 14, an inverter circuit 13c, the output filters 15, the output capacitors 18, and the output switches 16 are housed (disposed) in the housing 230 in this order from the upper side toward the lower side. That is, the input switches 11 are housed in the uppermost stage of the housing 230, and the output switches 16 are housed in the lowermost stage of the housing 230.

The plurality of uninterruptible power supply modules 201 and the input/output module 202 are coupled to each other by input buses 221 connected to each input switch 11 on the arrow Z1 direction side, and are coupled to each other by output buses 223 connected to each output switch 16 on the arrow Z2 direction side. In addition, the plurality of uninterruptible power supply modules 201 and the input/output module 202 are coupled to each other by a DC bus 214a connected to each DC reactor 14 in a central portion in an upward-downward direction.

The remaining configurations of the second embodiment are similar to those of the first embodiment.

[Effects of Second Embodiment]

According to the second embodiment, the following effects can be obtained.

According to the second embodiment, as described above, the housing 230 houses the input switches 11, the input filters 12, and the power converter 13 in this order from the upper side toward the lower side, and houses the output filters 15 and the output switches 16 in this order from the power converter 13 toward the lower side. When both the input switches and the output switches are provided in the uppermost stage or the lowermost stage, both the input buses and the output buses connected to the input switches and the output switches are disposed in the uppermost stage or the lowermost stage in the input/output module. In this case, the connection workability in the input/output module may conceivably be reduced due to congestion of the input buses and the output buses. On the other hand, according to the second embodiment, with the aforementioned configuration, the input switches 11 are housed on the relatively upper side (in the uppermost stage, for example) of the housing 230, and the output switches 16 are housed on the relatively lower side (in the lowermost stage, for example) of the housing 230. Consequently, the input buses 221 and the output buses 223 are disposed in a distributed manner in the upward-downward direction inside the input/output module 202, and hence it is possible to significantly reduce or prevent a reduction in the connection workability in the input/output module 202.

The remaining effects of the second embodiment are similar to those of the first embodiment.

[Modified Examples]

The embodiments disclosed this time must be considered as illustrative in all points and not restrictive. The range of the present invention is not shown by the above description of the embodiments but by the scope of claims for patent, and all modifications (modified examples) within the meaning and range equivalent to the scope of claims for patent are further included.

For example, while the three uninterruptible power supply modules are provided in the uninterruptible power supply in each of the aforementioned first and second embodiments, the present invention is not restricted to this. For example, one uninterruptible power supply module may alternatively be provided in the uninterruptible power supply, or two or four or more uninterruptible power supply modules may alternatively be provided in the uninterruptible power supply.

While the input switches are housed in the uppermost stage of the housing in each of the aforementioned first and second embodiments, the present invention is not restricted to this. That is, the input switches may alternatively be housed in a portion of the housing other than the uppermost stage.

For example, the input switches may be housed in the lowermost stage of the housing.

While the chopper circuit is configured as a three-level chopper circuit, and the inverter circuit is configured as a three-level inverter circuit in each of the aforementioned first and second embodiments, the present invention is not restricted to this. For example, the chopper circuit may alternatively be configured as a two-level chopper circuit, and the inverter circuit may alternatively be configured as a two-level inverter circuit.

While the fans are disposed on the upper surface of the housing in each of the aforementioned first and second embodiments, the present invention is not restricted to this. For example, the fans may alternatively be disposed on the bottom surface of the housing.

While the input buses, the output buses, and the power lines each have a bar shape in each of the aforementioned first and second embodiments, the present invention is not restricted to this. The input buses, the output buses, and the power lines may alternatively be configured as flexible conducting wires.

What is claimed is:

1. An uninterruptible power supply comprising:
   an input switch, an input filter, and a power converter disposed in this order;
   an output filter and an output switch disposed in this order from the power converter;
   a plurality of conductors that connects the input switch, the input filter, the power converter, the output filter, and the output switch to each other in this order; and
   a plurality of cases in which the input switch, the input filter, and the power converter are disposed in this order and in which the output filter and the output switch are disposed in this order from the power converter,
   wherein the plurality of cases houses the input switch, the input filter, and the power converter, the output filer and the output switch.

2. The uninterruptible power supply according to claim 1, wherein the input switch, the input filter, and the power converter are disposed in this order from an upper side toward a lower side.

3. The uninterruptible power supply according to claim 2, wherein the output filter and the output switch are disposed in this order from the power converter toward the upper side.

4. The uninterruptible power supply according to claim 3, wherein the plurality of cases includes
   a first case that houses the power converter;
   a second case that houses the input filter and the output filter; and
   a third case that houses the input switch and the output switch.

5. The uninterruptible power supply according to claim 3, wherein the power converter includes a rectifier circuit connected to the input filter, a chopper circuit connected to the rectifier circuit, and
   the input switch, the input filter, the rectifier circuit, and the chopper circuit are disposed in this order from the upper side toward the lower side.

6. The uninterruptible power supply according to claim 1, further comprising:
   a ventilation path in which air flows from an outside of the plurality of cases to another outside of the plurality of cases through the power converter and the input filter or the output filter; and
   a partition wall that separates the ventilation path from both the input switch and the output switch.

7. The uninterruptible power supply according to claim 4, further comprising:
- a ventilation path in which air flows from an outside of the plurality of cases to another outside of the plurality of cases through the power converter and the input filter or the output filter,
- wherein the ventilation path includes an air guide path provided at rear sides of all of the first case, the second case, and the third case, and
- the third case is airtight against the air guide path.

8. The uninterruptible power supply according to claim 6, further comprising:
- a fan discharging air inside the plurality of cases to the another outside of the plurality of cases;
- a plurality of uninterruptible power supply modules including fans on upper surfaces of the plurality of uninterruptible power supply modules and disposed adjacent to each other in a right-left direction;
- an input bus that connects input switches of the plurality of uninterruptible power supply modules to each other;
- an output bus that connects output switches of the plurality of uninterruptible power supply modules to each other; and
- a division wall that separates the plurality of uninterruptible power supply modules adjacent to each other from each other,
- wherein the division wall includes openings in which the input bus and the output bus are disposed.

\* \* \* \* \*

UNITED STATES PATENT AND TRADEMARK OFFICE
CERTIFICATE OF CORRECTION

PATENT NO. : 10,454,254 B2  
APPLICATION NO. : 16/073548  
DATED : October 22, 2019  
INVENTOR(S) : Seiitsu Kin et al.

Page 1 of 1

It is certified that error appears in the above-identified patent and that said Letters Patent is hereby corrected as shown below:

On the Title Page

Please change the item (22), from "PCT Filed: Jul. 4, 2017" to --Filed: Jul. 27, 2018--.

Please delete the whole item (86).

Please delete the whole item (87).

Please change the first line of the item (65), from "Prior Publication Data" to --Publication Data--.

Please change the second line of the item (63), from "… filed on Jul. 4, 2014" to --… filed on Jul. 4, 2017--.

Signed and Sealed this
Twenty-first Day of April, 2020

Andrei Iancu
*Director of the United States Patent and Trademark Office*